(12) United States Patent
Yen

(10) Patent No.: US 8,836,108 B2
(45) Date of Patent: Sep. 16, 2014

(54) CIRCUIT BOARD STRUCTURE AND PACKAGE STRUCTURE

(75) Inventor: Lee-Sheng Yen, Taoyuan County (TW)

(73) Assignee: Advance Materials Corporation, Taoyuan (TW)

( * ) Notice: Subject to any disclaimer, the term of this patent is extended or adjusted under 35 U.S.C. 154(b) by 29 days.

(21) Appl. No.: 12/835,746

(22) Filed: Jul. 14, 2010

(65) Prior Publication Data
US 2011/0260308 A1    Oct. 27, 2011

(30) Foreign Application Priority Data

Apr. 26, 2010   (TW) ................. 99113040 A

(51) Int. Cl.
| | | |
|---|---|---|
| H01L 23/48 | (2006.01) | |
| H01L 23/495 | (2006.01) | |
| H01L 21/683 | (2006.01) | |
| H01L 21/56 | (2006.01) | |
| H05K 3/10 | (2006.01) | |
| H01L 21/48 | (2006.01) | |
| H05K 3/02 | (2006.01) | |
| H01L 23/00 | (2006.01) | |
| H01L 23/31 | (2006.01) | |

(52) U.S. Cl.
CPC ........ H05K 3/10 (2013.01); *H01L 2924/01079* (2013.01); *H01L 2924/0105* (2013.01); *H01L 2224/83* (2013.01); *H01L 2224/48091* (2013.01); *H01L 2224/45139* (2013.01); *H01L 2924/01078* (2013.01); *H01L 2224/92247* (2013.01); H01L 23/49548 (2013.01); *H01L 2224/29339* (2013.01); *H05K 3/025* (2013.01); *H01L 24/85* (2013.01); *H01L 2924/01028* (2013.01); *H01L 2224/45147* (2013.01); *H01L 2224/45644* (2013.01); *H01L 24/29* (2013.01); *H01L 24/83* (2013.01); *H01L 2224/48227* (2013.01); *H01L 24/45* (2013.01); H01L 21/6835 (2013.01); *H01L 2924/01047* (2013.01); H01L 23/49541 (2013.01); H01L 23/49582 (2013.01); *H01L 21/568* (2013.01); *H01L 2224/73265* (2013.01); *H01L 2224/32225* (2013.01); *H01L 2224/92* (2013.01); *H01L 2924/15311* (2013.01); *H01L 2224/85001* (2013.01); *H01L 2224/48247* (2013.01); *H01L 2224/85439* (2013.01); *H01L 2224/32245* (2013.01); *H01L 2224/45144* (2013.01); *H01L 2224/85444* (2013.01); *H01L 2224/85455* (2013.01); *H01L 2224/45565* (2013.01); H01L 21/4821 (2013.01); *H01L 23/3121* (2013.01); *H01L 24/48* (2013.01)

USPC ................ 257/700; 257/E23.06; 438/121

(58) Field of Classification Search
CPC .................. H01L 23/49541; H01L 23/49548; H01L 23/49582
USPC ................ 257/700, 773, E23.06; 438/121
See application file for complete search history.

(56) References Cited

U.S. PATENT DOCUMENTS

| | | | |
|---|---|---|---|
| 5,480,503 A | 1/1996 | Casey | |
| 6,569,712 B2 | 5/2003 | Ho | |
| 6,769,174 B2 | 8/2004 | Siegel | |
| 6,853,060 B1 | 2/2005 | Seok | |
| 7,247,526 B1 | 7/2007 | Fan | |
| 2002/0168798 A1* | 11/2002 | Glenn et al. ................. | 438/110 |
| 2004/0200062 A1 | 10/2004 | Siegel | |
| 2006/0261446 A1* | 11/2006 | Wood et al. ................. | 257/621 |
| 2007/0090524 A1* | 4/2007 | Abbott ......................... | 257/731 |
| 2007/0105270 A1 | 5/2007 | Lee | |
| 2008/0290513 A1 | 11/2008 | Byun | |
| 2009/0041270 A1* | 2/2009 | Schrank et al. ............. | 381/174 |

FOREIGN PATENT DOCUMENTS

| | | |
|---|---|---|
| CN | 101488463 A | 7/2009 |
| JP | 200494502 A | 3/2004 |
| KR | 20000041060 A | 7/2000 |
| KR | 1020090052688 A | 5/2009 |
| TW | 552694 | 9/2003 |
| TW | 200610073 | 3/2006 |
| TW | 200939417 | 9/2009 |

* cited by examiner

Primary Examiner — Tom Thomas
Assistant Examiner — Christopher M Roland
(74) Attorney, Agent, or Firm — Winston Hsu; Scott Margo

(57) ABSTRACT

A circuit board structure, a packaging structure and a method for making the same are disclosed. First, a first substrate and a second substrate are provided. The first substrate includes a release film attached to a carrier. The second substrate includes a copper film covered with a solder mask. Second, the solder masked is patterned. Next, the release film and the patterned solder mask are pressed together so that the first substrate is attached to the second substrate. Then, the copper film is patterned to form a first pattern and a second pattern. The first pattern is in direct contact with the release film and the second pattern is in direct contact with the patterned solder mask. Later, a passivation is formed to cover the first pattern and the second pattern to form a circuit board structure. Afterwards, a package is formed on the carrier to form a packaging structure.

4 Claims, 10 Drawing Sheets

CIRCUIT BOARD STRUCTURE AND PACKAGE STRUCTURE

BACKGROUND OF THE INVENTION

1. Field of the Invention

The present invention generally relates to a method for making a circuit board structure, the circuit board structure and a package structure obtained therefrom. In particular, the present invention is directed to a method for making a circuit board structure and a package structure by means of a carrier with an attached release film to support a copper film covered with a solder mask to the circuit board structure and the package structure.

2. Description of the Prior Art

A circuit board is an essential component of an electronic device. With the trend of always scaling down the size of the electronic devices, various carrier structures are therefore proposed to support the die. Some pins extend outwards to connect other circuits surrounding the circuit board to form proper electrical connections.

As far as the current technology is concerned, a circuit structure called "lead frame" is conventionally known. FIGS. 1-4 illustrate a method for making a traditional lead frame. Please refer to FIG. 1, first a metal substrate 101 is provided. Second, please refer to FIG. 2, the metal substrate 101 is patterned to form a circuit pattern 110 and a die pad 111 which correspond to a die (not shown). Later, via holes 122 are formed, pins 120 are connected to the metal substrate 101 as well as pins 120 and the die pad 111 are plated with silver 121. Next, please refer to FIG. 3, the die 130 is attached to the die pad 111 then followed by a wire bonding step and a tin plating step. Afterwards, please refer to FIG. 4, the pins are shaped to obtained a package structure 102. The data in the die is connected with the outer circuits by the pins 120.

However, as the data processed by the die increases and the speed for processing needs to be higher, the lead frame as illustrated cannot provide more pins 120 to meet the demands because the space around the die is so limited. In such a way, the application of the traditional lead frame 102 as a result is restricted.

FIG. 5 illustrates another carrier structure 201 for supporting dies. In the carrier structure 201, the circuit patterns 220 are respectively disposed on both opposite sides of the substrate 210. In addition, the solder mask layer 230 is selectively disposed on both opposite sides of the substrate 210 to properly protect the circuit pattern 220. Apart from this, some of the circuit pattern 220 is exposed. In the carrier structure 201, independent solder mask layers 231/232 need to be formed on both opposite sides of the substrate 210. The patterns of the solder mask layers 231/232 are usually distinctively different so that they can cope with different demands, such as location, of die pads (not shown) and different solder balls (not shown).

After the carrier structure 201 for supporting dies as illustrated in FIG. 5 undergoes suitable packaging steps, the package structure 202 as illustrated in FIG. 6 is obtained. In addition to the substrate 210, the circuit pattern 220, the solder mask layer 230, and the solder mask layers 231/232 as illustrated in FIG. 5, there are an extra die pad 221, die 240, bonding wire 250, sealant material 200 and solder balls 270 in the package structure 202 as illustrated in FIG. 6 due to the subsequent packaging steps.

The die 240 is disposed on the die pad 221 within the circuit pattern 220 and surrounded by the solder mask layer 231 at the same time as well as electrically connected to other parts of the circuit pattern 220 by means of the bonding wires 250. The sealant material 200 completely covers the die pad 221, the die 240, the bonding wire 250 and partially covers the substrate 210 and the solder mask layer 230. The solder balls 270 are surrounded by the solder mask layer 232. In both the carrier structure 201 for supporting dies as illustrated in FIG. 5 and the package structure 202 as illustrated in FIG. 6, the solder mask layers 231/232 are independently disposed on two opposite sides of the substrate 210 and extend to the margins of the substrate 210.

In the light of the above-mentioned carrier structures, the package structures and the conventional methods for making lead frames are not yet perfect, thus other novel carrier structures, package structures and the fabrication methods are still needed to provide a much simpler structure and to be free from conventional pin count restrictions.

SUMMARY OF THE INVENTION

The present invention hence proposes a novel circuit board structure, a novel package structure and the novel fabrication methods thereof. The circuit board structure and the package structure of the present invention employ a one-side-patterned solder mask so the total structure and the fabrication methods are much simplified. Besides, the circuit board structure and the package structure of the present invention can break the restriction of insufficient pins encountered in the prior art in order to keep pace with the demands for more pins when the data processed by the die increases and the speed for processing needs to be higher.

The present invention in a first aspect proposes a method for making a circuit board structure. First, a first substrate and a second substrate are provided. The first substrate includes a release film attached to a carrier. The second substrate includes a copper film covered with a first solder mask. Second, the first solder mask is patterned on one side only. Next, the release film and the patterned first solder mask are pressed together so that the first substrate is attached to the second substrate. Then, the copper film is patterned to form a first pattern and a second pattern. The first pattern is in direct contact with the release film and the second pattern is in direct contact with the patterned first solder mask. Later, a first protective layer is formed to cover the first pattern and the second pattern to form a circuit board structure.

In one embodiment of the present invention, the first pattern is a die pad and the second pattern is a circuit pattern which is protected by the patterned solder mask. In another embodiment of the present invention, a second solder mask may be formed to selectively cover the second pattern. In still another embodiment of the present invention, a packaging structure may be formed to be disposed on the carrier. In a further embodiment of the present invention, the release film and the carrier may be optionally removed to expose the first pattern and the patterned solder mask to obtain another packaging structure.

The present invention in a second aspect proposes a circuit board structure. The circuit board structure of the present invention includes a carrier, a release film, a patterned solder mask, a first conductive pattern, a second conductive pattern and a protective layer. The release film is attached to the carrier. The single-side-patterned solder mask is disposed on the release film and in direct contact with the release film. The first conductive pattern is disposed on the release film and in direct contact with the release film. The second conductive pattern is disposed on the release film, adjacent to the first conductive pattern and in direct contact with the patterned solder mask. The protective layer covers the first conductive pattern and the second conductive pattern.

The present invention in a third aspect proposes a circuit board structure. The circuit board structure of the present invention includes a carrier, a release film, a patterned solder mask, a first conductive pattern, a second conductive pattern, a covering solder mask and a protective layer. The release film is attached to the carrier. The single-side-patterned solder mask is disposed on the release film and in direct contact with the release film. The first conductive pattern is disposed on the release film and in direct contact with the release film. The second conductive pattern is disposed on the release film, adjacent to the first conductive pattern and in direct contact with the patterned solder mask. The covering solder mask selectively covers the second conductive pattern. The protective layer covers the first conductive pattern and the second conductive pattern.

The present invention in a fourth aspect proposes a package structure. The package structure of the present invention includes a sealant material, a single-side-patterned solder mask, a first conductive pattern, a second conductive pattern, a first protective layer, a second protective layer, a die and a bonding wire. The patterned solder mask is disposed on a surface of the sealant material. The first conductive pattern is disposed on the same surface as the sealant material. The second conductive pattern is disposed in the sealant material, adjacent to the first conductive pattern and in direct contact with the patterned solder mask. The first protective layer is completely disposed in the sealant material and covers the first conductive pattern and the second conductive pattern. The second protective layer completely covers the first conductive pattern. The die is completely disposed in the sealant material and on the first pattern. The bonding wire is also completely disposed in the sealant material and selectively electrically connects the die and the first conductive pattern.

The present invention in a fifth aspect proposes another package structure. The package structure of the present invention includes a sealant material, a single-side-patterned solder mask, a first conductive pattern, a second conductive pattern, a covering solder mask, a first protective layer, a second protective layer, a die and a bonding wire. The patterned solder mask is disposed on a surface of the sealant material. The first conductive pattern is disposed on the same surface as the sealant material. The second conductive pattern is disposed in the sealant material, adjacent to the first conductive pattern and in direct contact with the patterned solder mask. The covering solder mask completely covers the second conductive pattern. The first protective layer is completely disposed in the sealant material and covers the first conductive pattern. The second protective layer is disposed completely outside the sealant material, covers the first conductive pattern. The die is completely disposed in the sealant material and on the first pattern. The bonding wire is also completely disposed in the sealant material and selectively electrically connects the die and the first conductive pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIGS. 1-4 illustrate a method for making a traditional lead frame.
Figure 2:
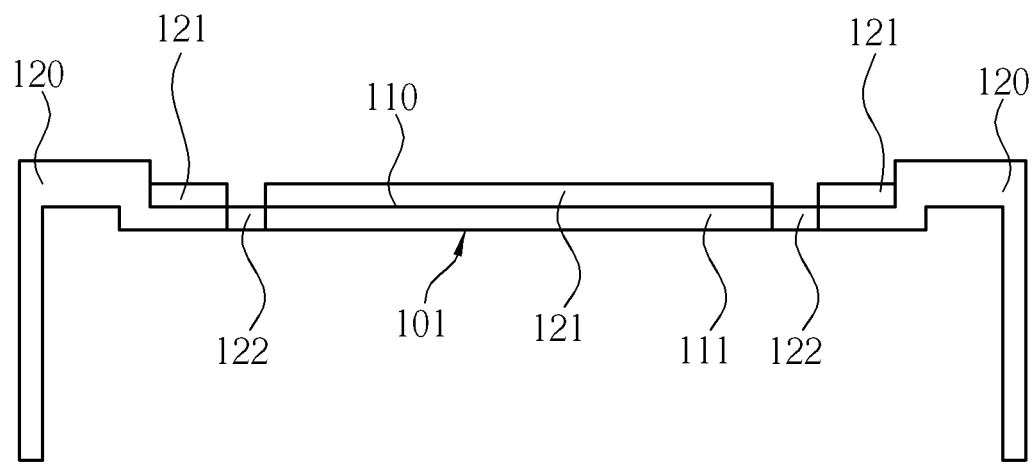
Figure 3:
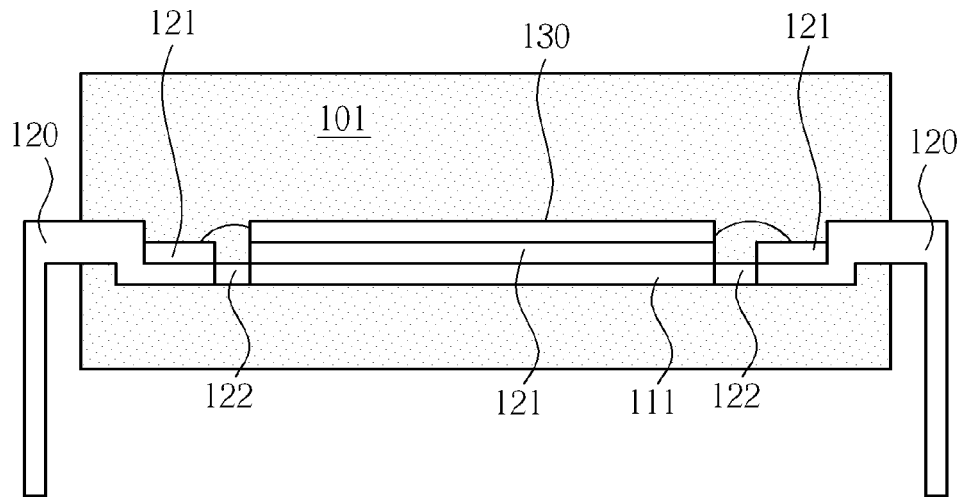
Figure 4:
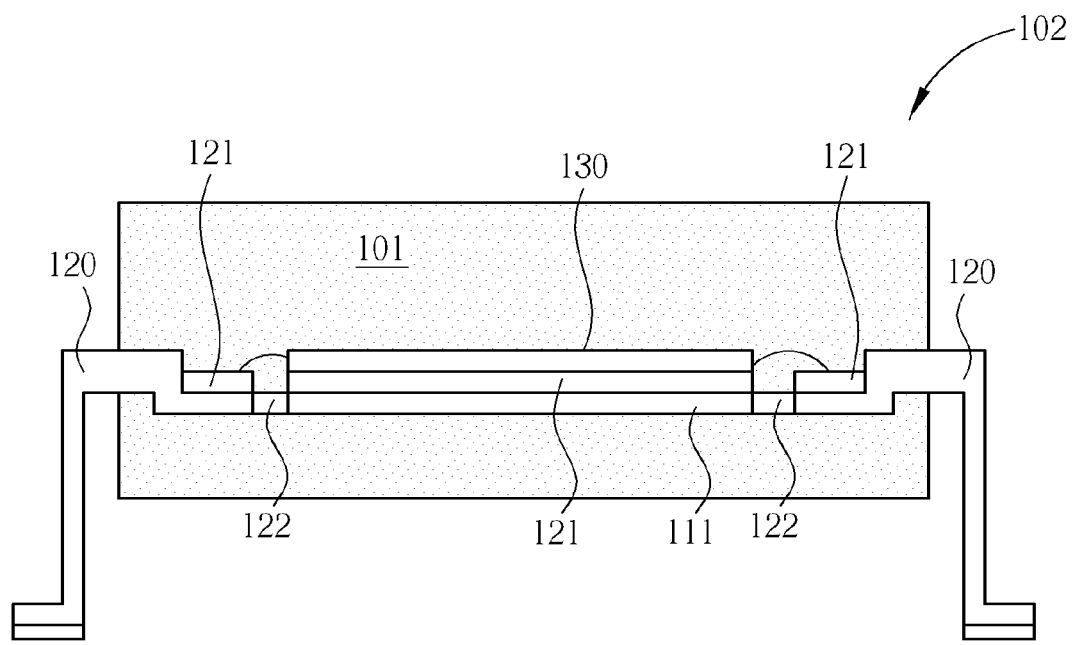
Figure 5:
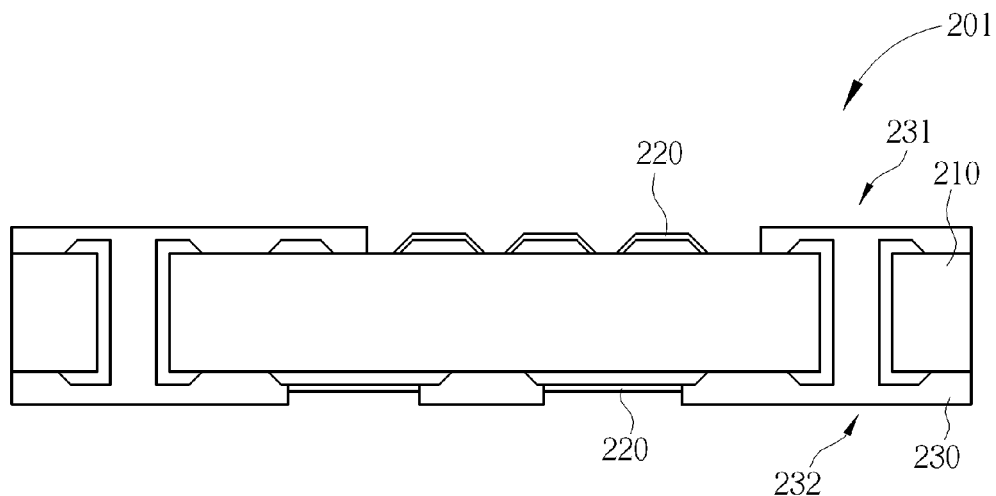
FIG. 5 illustrates another traditional carrier structure for supporting dies.
Figure 6:
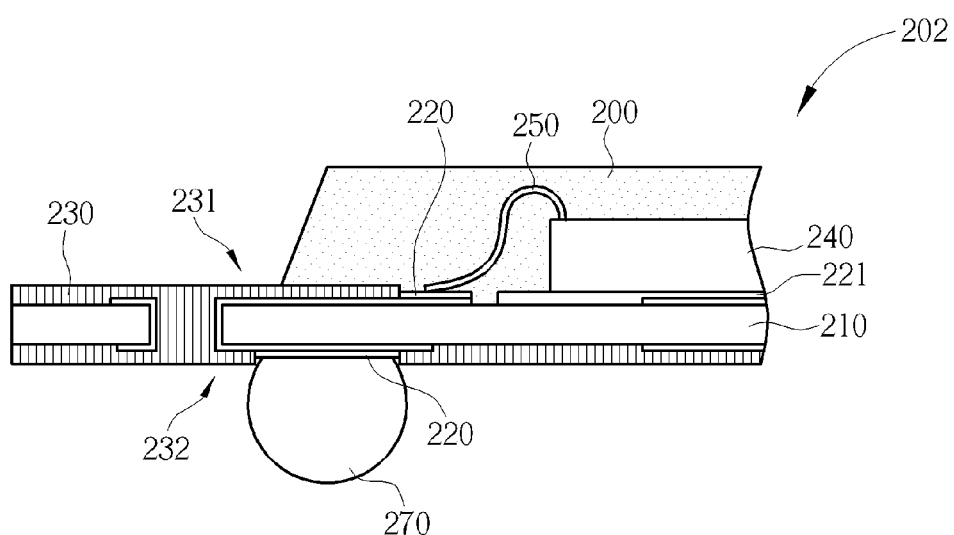
FIG. 6 illustrates a traditional package structure.
Figure 7:
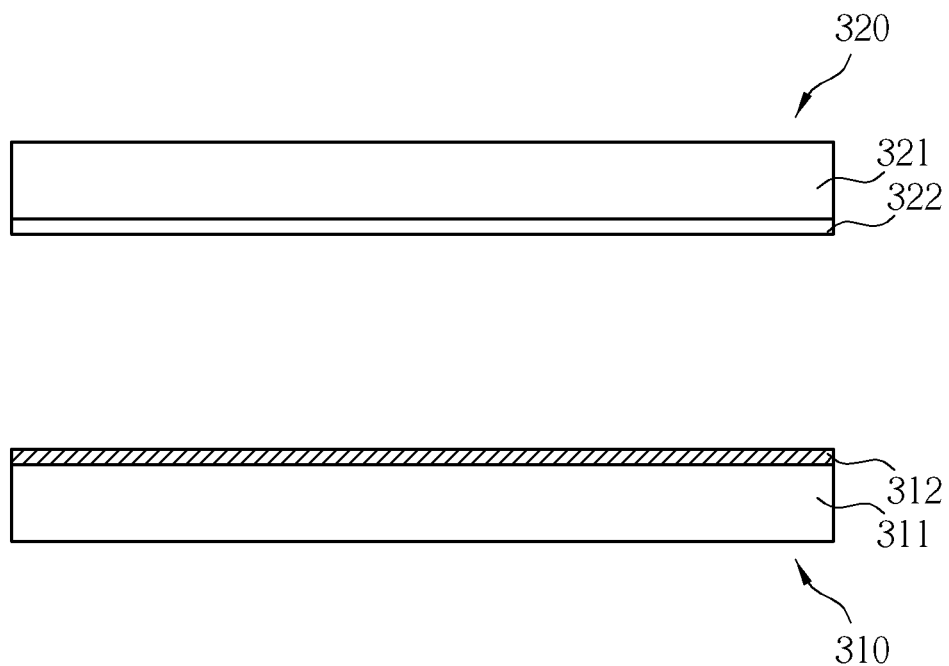
FIGS. 7-11 illustrate the method for making a circuit board structure of the present invention.

The present invention in a first aspect provides a first embodiment of the method for making a circuit board structure. FIGS. 7-11 illustrate the method for making the circuit board structure of the present invention. Please refer to FIG. 7, initially a first substrate 310 and a second substrate 320 are provided. The first substrate 310 and the second substrate 320 may be prepared separately. They can be laminated together to form a single substrate (not shown) when needed. The first substrate 310 includes a carrier 311, and a release film 312 which is attached to one side of the carrier 311. The second substrate 320 includes a copper film 321 with a thickness of about 10 μm-70 μm, preferably 10 μm-35 μm. Only one side of the copper film 321 is covered with a solder mask 322.

The carrier 311 may be any suitable material, such as polyethylene terephthalate (PET), polycarbonate (PC), polymethylmethacrylate (PMMA) or a copperless substrate. The release film 312 may be a plastic and sticky material and has better adhesion to the carrier 311. The release film 312 accordingly adheres to one side of the carrier 311 by means of such adhesion. For a trial production, on one hand the release film 312 may be applied to the carrier 311 by means of screen printing. On the other hand, for a mass production, the release film 312 may be applied to the carrier 311 by means of rollers.

Figure 8:
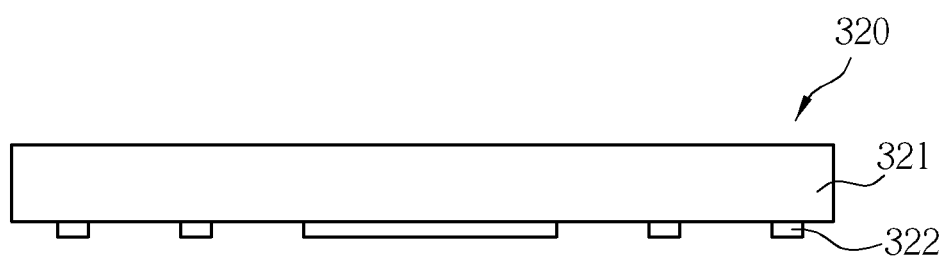

Second, please refer to FIG. 8. Before the first substrate 310 and the second substrate 320 are pressed together, the solder mask 322 is patterned in advance. The solder mask 322 may be patterned by means of conventional lithography or laser opening . . . etc. The pattern on the solder mask 322 may be previously designed to go with the demands of the later steps. For example, the patterning procedure is only carried out on one side of the solder mask 322 to obtain a single-side-patterned solder mask 322.

Figure 9:
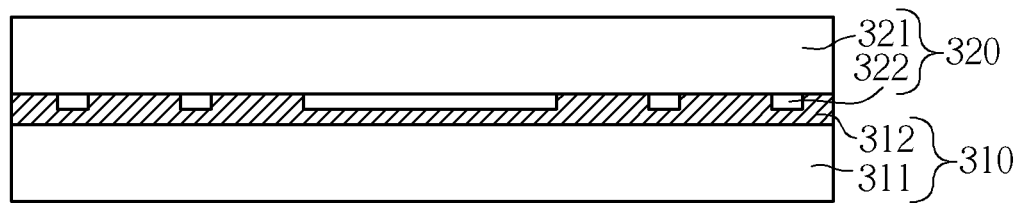

Then, please refer to FIG. 9, the release film 312 and the patterned solder mask 322 may be pressed together so that the first substrate 310 is attached to the second substrate 320. Because the release film 312 may be a plastic and sticky material, in one embodiment of the present invention, the patterned solder mask 322 is embedded into the release film 312 when the first substrate 310 is attached to the second substrate 320. Accordingly, the copper film 321 is in direct contact with the release film 312. In addition, because the release film 312 has a stronger adhesion to the carrier 311, there is a weaker adhesion between the release film 312 and the patterned solder mask 322. At the moment, one side of the copper film 321 is exposed.

Figure 10:
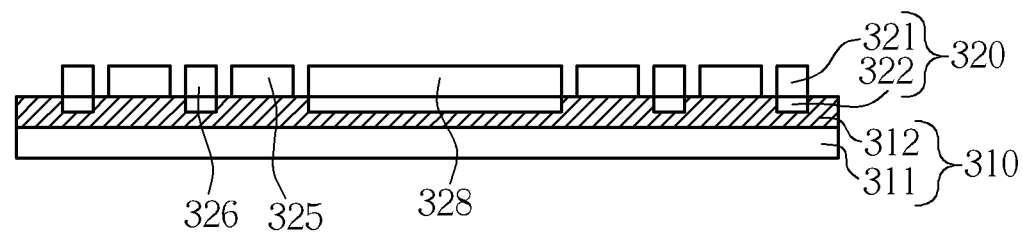

Next, please refer to FIG. 10. In a first embodiment, because one side of the copper film 321 is still exposed, the copper film 321 will have a pattern such as a first pattern 325, a die pad 328 and a second pattern 326 once the copper film 321 is suitably patterned. The copper film 321 may be patterned by a wet film method or by a dry film method. The first pattern 325 and the second pattern 326 each may have different functions. In one embodiment of the present invention the first pattern 325 may be a connecting pad and the second pattern 326 may be a circuit pattern 326 which is protected by the patterned solder mask 322. In other words, the second pattern 326 corresponds to the patterned solder mask 322. As a result, shown in FIG. 10, the first pattern 325 is in direct contact with the release film 312 but the second pattern 326 is in direct contact with the patterned solder mask 322.

Figure 10A:
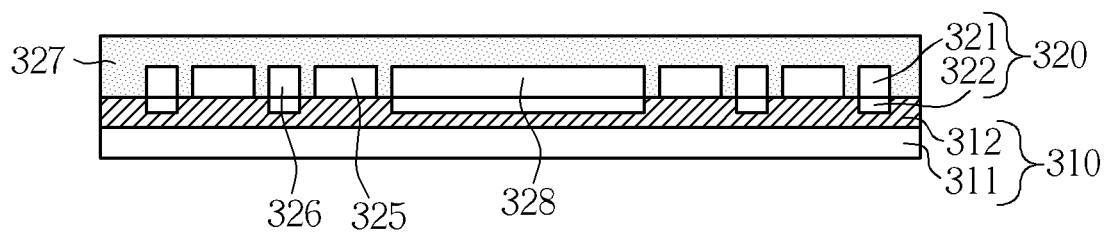
Figure 10B:
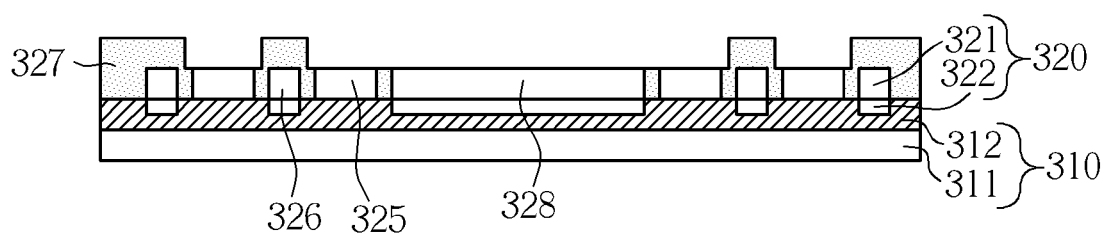

In a second embodiment of the present invention for making a circuit board structure as shown in FIG. 10A, a covering solder mask 327 may be optionally formed to completely cover the first pattern 325, the die pad 328 and the second pattern 326 and to surround the first pattern /first conductive pattern 325 and the second pattern/second conductive pattern 326. The covering solder mask 327 may serve as a protection layer of the second pattern 326 to be followed with, please refer to FIG. 10B, the covering solder mask 327 is patterned to expose the needed element(s). For example, the covering solder mask 327 is patterned to expose the first pattern 325, the die pad 328 and to cover the second pattern 326 so the covering solder mask 327 may serve as the protection layer of the second pattern 326.

Figure 11:
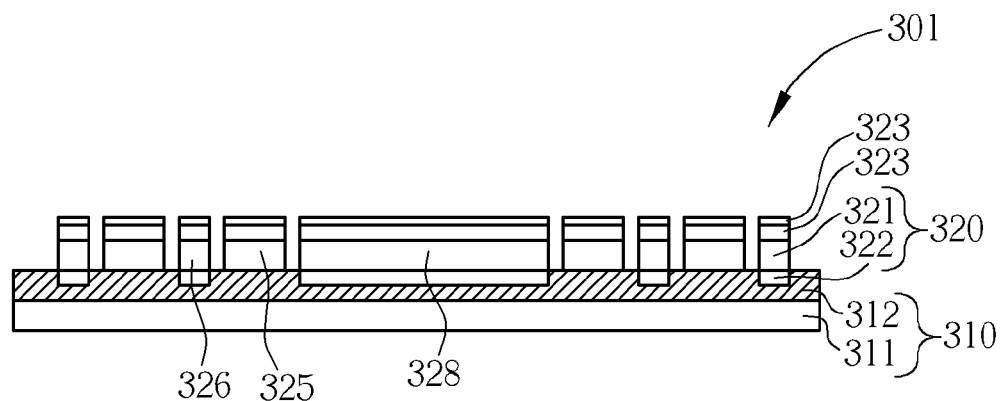

Afterwards, as shown in FIG. 11 a first protective layer 323 should be formed on the surface of the copper film 321 in order to protect the fragile copper film 321. Because there are the first pattern 325 and the second pattern 326 of different functions on the patterned copper film 321, the first protective layer 323 covers the first pattern 325 and the second pattern 326, too. A method such as an electroplating step may be used to form the first protective layer 323 on the surface of the copper film 321. The first protective layer 323 may be a composite material layer. For instance, the first protective layer 323 may include at least one of Ni, Ag and Au, to form a Ni/Au protective layer.

Figure 11A:
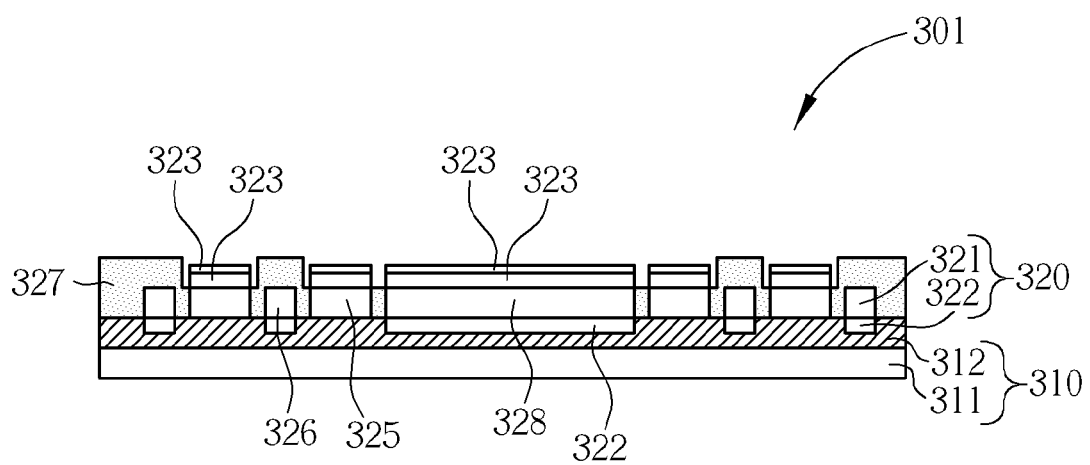

Or alternatively, as shown in FIG. 11A, in order to protect the fragile copper film 321 a first protective layer 323 should be formed on the surface of the copper film 321 so the first protective layer 323 covers the first pattern 325 and the die pad 328. A method such as an electroplating step may be used to form the first protective layer 323 on the surface of the copper film 321. The first protective layer 323 may be a composite material layer. For instance, the first protective layer 323 may include at least one of Ni, Ag and Au, to form a Ni/Au protective layer.

After the aforesaid steps, the laminated first substrate 310 and second substrate 320 together form a novel circuit board structure 301. Please refer to FIG. 11, illustrating a first embodiment of the circuit board structure 301 proposed by the present invention and FIG. 11A illustrates a second embodiment of the circuit board structure 301 of the present invention. The circuit board structure 301 of the present invention includes the carrier 311, the release film 312, a patterned solder mask 322, a first conductive pattern 325, a second conductive pattern 326 and a first protective layer 323. Providing the circuit board structure 301 further includes a covering solder mask 327, it is illustrated in FIG. 11A, which is a second embodiment of the circuit board structure 301 provided by the present invention.

As described earlier, the release film 312 is attached to the carrier 311 with a stronger adhesion therebetween. The patterned solder mask 322 is disposed on the release film 312 and in direct contact with the release film 312. In one embodiment of the present invention, when the patterned solder mask 322 of the second substrate 320 is attached to the release film 312 of the first substrate 310, preferably the patterned solder mask 322 is embedded in the release film 312. The first conductive pattern 325 and the second conductive pattern 326 are respectively disposed on the release film 312. On one hand, the first conductive pattern 325 is in direct contact with the release film 312. On the other hand, the second conductive pattern 326 is in direct contact with the patterned solder mask 322. In other words, the second conductive pattern 326 corresponds to the patterned solder mask 322. Further, the first conductive pattern 325 and the second conductive pattern 326 are often adjacent to each other or arranged in an alternate order. The first protective layer 323 covers the first conductive pattern 325 and the second conductive pattern 326. The first protective layer 323 may include at least one of Ni, Ag and Au, to form a composite Ni/Au protective layer.

Figure 12:
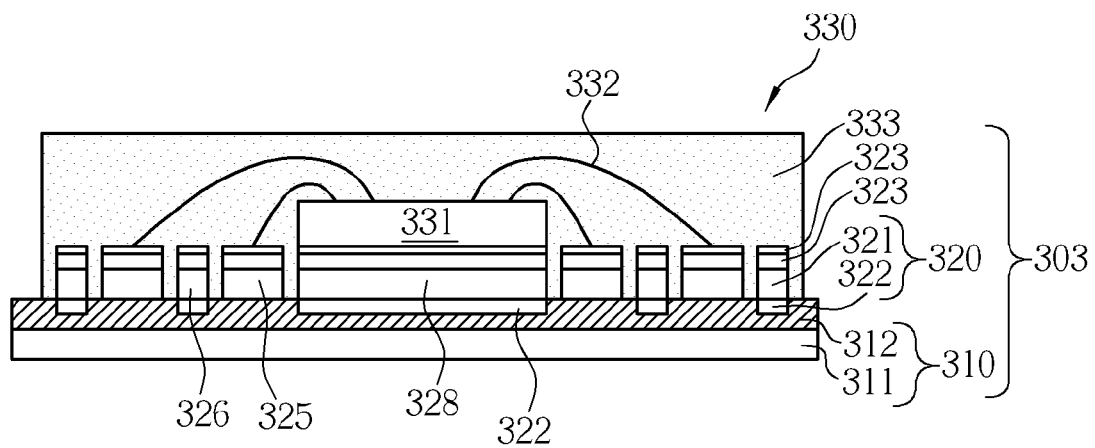
FIG. 12 illustrates a first embodiment of an extension method for making the pre-package structure of the present invention.
Figure 12A:
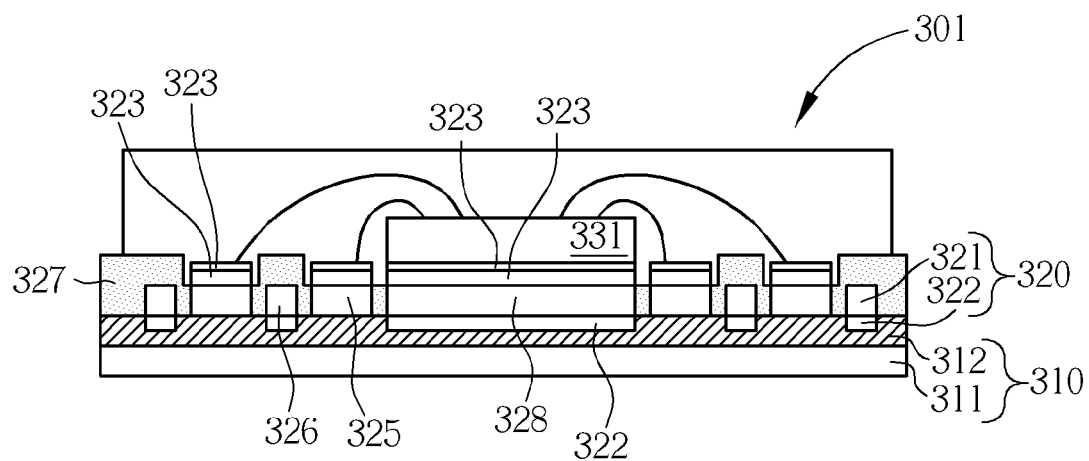
FIG. 12A illustrates another embodiment of an extension method for making the pre-package structure of the present invention with an additional covering solder mask of the circuit board structure.

In another embodiment of the present invention, the circuit board structure 301 as illustrated in FIG. 11 may further become a pre-package structure 303 after a pre-package step. FIG. 12 illustrates a first embodiment of an extension method for making the pre-package structure of the present invention; FIG. 12A illustrates another embodiment of an extension method for making the pre-package structure of the present invention with an additional covering solder mask 327 of the circuit board structure 301. Please refer to FIGS. 12 and 12A, a package 330 may be further formed on the carrier 311 of the circuit board structure 301 as illustrated in FIGS. 11 and 11A. For example, the die 331 is first adhered to a first pattern 325, that is, the die pad 328. For example, a silver paste or a thermal-dissipating material (not shown) is used to attach the die 331 onto the first pattern 325. Then, bonding wires 332, such as copper wires, silver wires, gold wires or gold-plated copper wires, are used to optionally connect the die 331 to part of the first pattern 325 electrically. After the electrical connection is completed, a sealant material 333, such as an epoxy resin, may be employed to hermetically seal the die 331 and the bonding wires 332 to keep the die 331 and the bonding wires 332 from the atmosphere, such as humidity.

As shown in FIG. 12, the sealant material 333 not only hermetically seals the die 331 and the bonding wires 332, the sealant material 333 but also in direct contact with the release film 312 and the patterned solder mask 322. As shown in FIG. 12A, the sealant material 333 hermetically seals the covering solder mask 327. The circuit board structure 301 as illustrated in FIG. 11 may further become a pre-package structure 303 as shown in FIG. 12 after a package 330 is further formed on the carrier 311.

Figure 13:
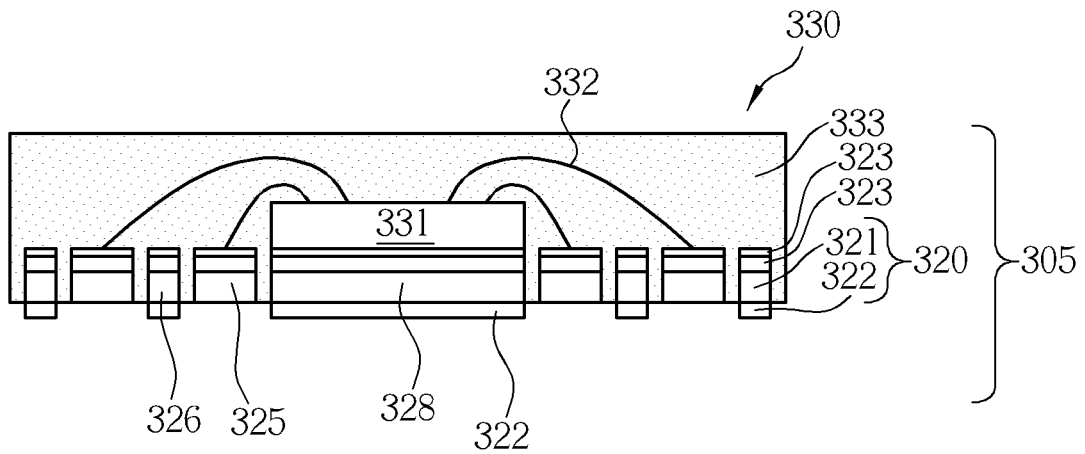
FIG. 13 illustrates an first embodiment of an extension method for making the pre-package structure of the present invention.
Figure 13A:
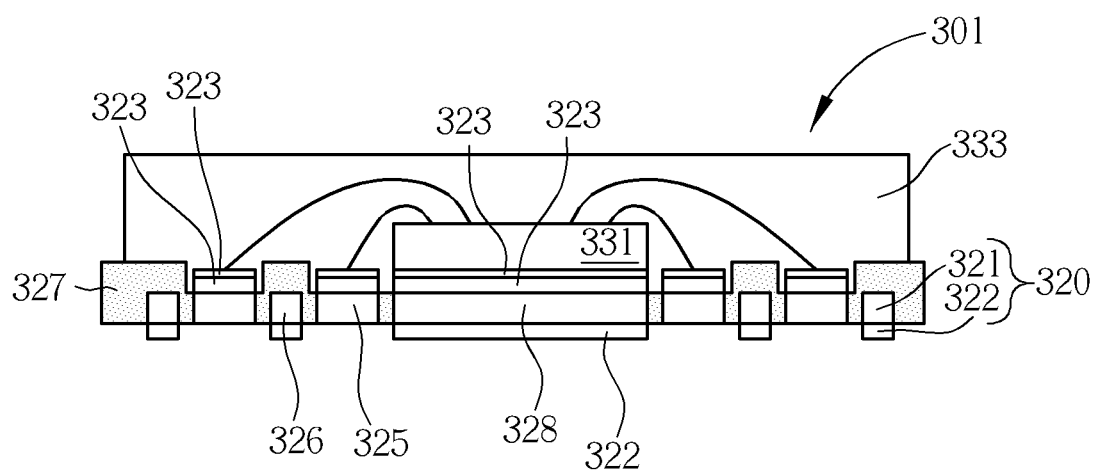
FIG. 13A illustrates a second embodiment of an extension method for making the pre-package structure of the present invention with an additional covering solder mask of the circuit board structure.

In still another embodiment of the present invention, the pre-package structure 303 as illustrated in FIG. 12 may further become a pre-package structure 305 after another pre-package step. FIG. 13 illustrates an first embodiment of an extension method for making the pre-package structure of the present invention; FIG. 13A illustrates a second embodiment of an extension method for making the pre-package structure of the present invention with an additional covering solder mask 327 of the circuit board structure 301. Please refer to FIGS. 13 and 13A. The carrier 311 and the release film 312 may be respectively removed from the pre-package structure 303 as illustrated in FIGS. 12 and 12A to obtain the pre-package structure 305.

Please note that the carrier 311 and the release film 312 can be easily removed form the pre-package structure 303 without jeopardizing other parts of the pre-package structure 303 because the release film 312 has a stronger adhesion to the carrier 311 and a relatively weaker adhesion to the patterned solder mask 322. At this moment, the patterned solder mask 322 is selectively disposed between the first pattern 325. After the carrier 311 and the release film 312 is removed from the pre-package structure 303, the patterned solder mask 322 and the first pattern 325 in the pre-package structure 305 are exposed.

Figure 14:
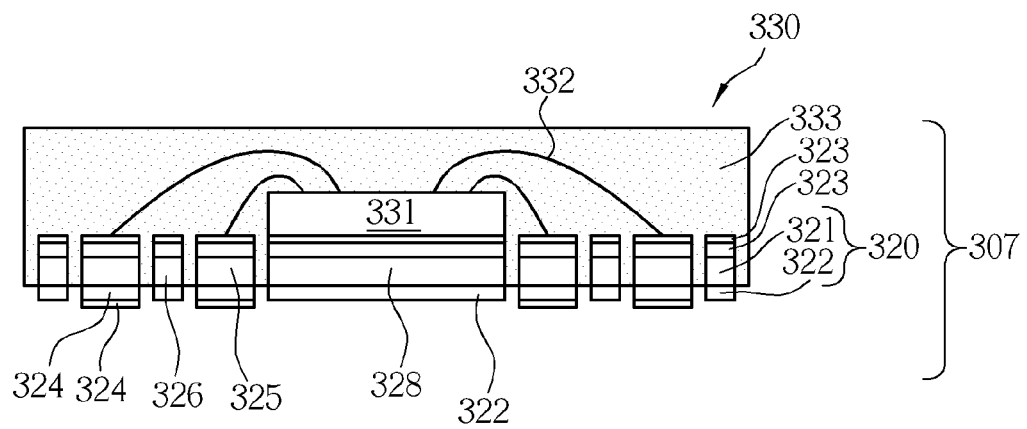
FIG. 14 illustrates an extension method for making the package structure of the present invention.

In order to protect the fragile copper film of the first pattern 325, in still another embodiment of the present invention, the pre-package structure 305 shown in FIG. 13 may further become a package structure 307 after a packaging step. FIG. 14 illustrates an extension method for making the package structure of the present invention. Please refer to FIG. 14, a second protection layer 324 may be further formed on the first pattern 325 in the pre-package structure 305 shown in FIG. 13 to completely cover the first pattern 325. The second protection layer 324 may include at least one of Ni, Ag and Au, or an OSP (Organic Solderability Preservative) to form a Ni/Au protective layer.

Figure 14A:
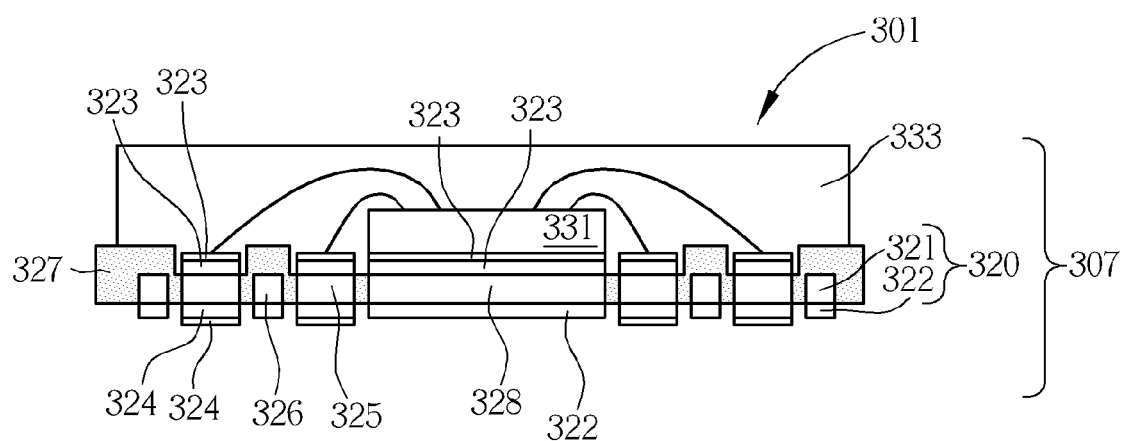
FIG. 14A illustrates a second embodiment of the package structure of the present invention with an additional covering solder mask of the circuit board structure.

After the aforesaid steps, a novel package structure 307 is obtained. Please refer to FIG. 14, illustrating a first embodiment of the package structure 307 of the present invention; FIG. 14A illustrates a second embodiment of the package structure 307 of the present invention with an additional covering solder mask 327 of the circuit board structure 301. In the package structure 307 of the present invention, there are a patterned solder mask 322, a first conductive pattern 325, a second conductive material 326, a first protective layer 323, a second protective layer 324, a die 331, a bonding wire 332 and a sealant material 333.

In the package structure 307 of the present invention as shown in FIG. 14, it is observed that the patterned solder mask 322 is disposed on one surface of the sealant material 333. The patterned solder mask 322 is partially in contact with the sealant material 333 and partially exposed. The sealant material 333 is usually a hermetical material, such as an epoxy resin. The first conductive pattern 325 is disposed on the same surface as the patterned solder mask 322 is on the sealant material 333. The first conductive pattern 325 usually serves to define the die pad for the die 331. The second conductive material 326 is also disposed in the sealant material 333 and defines a circuit pattern. Further, the second conductive material 326 is also in direct contact with the patterned solder mask 322 and protected by the patterned solder mask 322. In other words, the second conductive material 326 corresponds to the patterned solder mask 322. In addition, the second conductive material 326 is adjacent to the first conductive pattern 325 and in direct contact with the patterned solder mask 322. In FIG. 14A, the covering solder mask 327 directly covers the second conductive material 326.

In one aspect, the first protection layer 323 is completely disposed in the sealant material 333 and covers the first conductive pattern 325 and the second conductive material 326. In another aspect, the second protection layer 324 is completely disposed outside the sealant material 333 and completely covers the first conductive pattern 325. The first protection layer 323 and the second protection layer 324 may independently include at least one of Ni, Ag and Au, or an OSP (Organic Solderability Preservative). The die 331 is disposed on the first conductive pattern 325 and optionally electrically connected to the first conductive pattern 325 by the bonding wire 332. The die 331 and the bonding wire 332 are simultaneously disposed in the sealant material 333 to form a package. Other features of the package structure 307 of the present invention, such as the package, may refer to the above descriptions and will not be repeated here.

Those skilled in the art will readily observe that numerous modifications and alterations of the device and method may be made while retaining the teachings of the invention.

What is claimed is:

1. A circuit board structure, comprising:
a carrier;
a release film attached to said carrier;
a patterned solder mask inlaid into said release film;
a die pad in direct contact with said patterned solder mask;
a first conductive pattern disposed on said release film and in direct contact with said release film;
a second conductive pattern disposed on said release film, adjacent to said first conductive pattern and in direct contact with said patterned solder mask;
a covering solder mask selectively covering and surrounding said second conductive pattern; and
a protective layer covering said first conductive pattern,
wherein said patterned solder mask only covers a bottom surface of said second conductive pattern and a bottom surface of said die pad.

2. A package structure, comprising:
a sealant material;
a patterned solder mask disposed on a surface of said sealant material;
a first conductive pattern disposed on said surface of said sealant material;
a die pad disposed in said sealant material, wherein the die pad is in direct contact with said patterned solder mask;
a second conductive pattern disposed in said sealant material, adjacent to said first conductive pattern and in direct contact with said patterned solder mask;
a covering solder mask directly covering and surrounding said second conductive pattern;
a first protective layer completely disposed in said sealant material and covering said first conductive pattern;
a second protective layer completely disposed outside said sealant material and covering said first conductive pattern;
a die completely disposed in said sealant material and on said die pad; and
a bonding wire completely disposed in said sealant material and selectively electrically connecting said die and said first conductive pattern,
wherein said patterned solder mask only covers a bottom surface of said second conductive pattern and a bottom surface of said die pad.

3. The package structure of claim 2, wherein said covering solder mask is partially in contact with said sealant material and is partially exposed.

4. The package structure of claim 2, wherein said second conductive pattern is a circuit pattern which is protected by said patterned solder mask.

* * * * *